United States Patent
Ma et al.

(10) Patent No.: US 12,351,903 B2
(45) Date of Patent: Jul. 8, 2025

(54) METHOD AND SYSTEM FOR DEPOSITING MOLYBDENUM LAYERS

(71) Applicant: ASM IP Holding B.V., Almere (NL)

(72) Inventors: Paul Ma, Scottsdale, AZ (US); Roghayyeh Lotfi, Scottsdale, AZ (US); Jaebeom Lee, Tempe, AZ (US); Eric Christopher Stevens, Tempe, AZ (US); Amit Mishra, Tempe, AZ (US)

(73) Assignee: ASM IP Holding B.V., Almere (NL)

(*) Notice: Subject to any disclaimer, the term of this patent is extended or adjusted under 35 U.S.C. 154(b) by 94 days.

(21) Appl. No.: 18/142,283

(22) Filed: May 2, 2023

(65) Prior Publication Data

US 2023/0279539 A1 Sep. 7, 2023

Related U.S. Application Data

(62) Division of application No. 17/376,238, filed on Jul. 15, 2021, now Pat. No. 11,674,220.

(60) Provisional application No. 63/054,118, filed on Jul. 20, 2020.

(51) Int. Cl.
| | |
|---|---|
| C23C 16/06 | (2006.01) |
| C23C 16/30 | (2006.01) |
| C23C 16/32 | (2006.01) |
| C23C 16/455 | (2006.01) |
| C23C 28/00 | (2006.01) |

(52) U.S. Cl.
CPC ............ *C23C 16/06* (2013.01); *C23C 16/303* (2013.01); *C23C 16/305* (2013.01); *C23C 16/32* (2013.01); *C23C 16/45527* (2013.01); *C23C 28/341* (2013.01)

(58) Field of Classification Search
None
See application file for complete search history.

(56) References Cited

U.S. PATENT DOCUMENTS

| | | |
|---|---|---|
| 3,951,612 A | 4/1976 | Gates et al. |
| 5,028,565 A | 7/1991 | Chang et al. |
| 5,242,860 A | 9/1993 | Nulman et al. |
| 6,482,262 B1 | 11/2002 | Elers et al. |
| 6,656,831 B1 | 12/2003 | Le et al. |
| 7,189,641 B2 | 3/2007 | Lee et al. |

(Continued)

FOREIGN PATENT DOCUMENTS

| | | |
|---|---|---|
| CN | 109427570 A | 3/2019 |
| JP | H01149506 A | 6/1989 |

(Continued)

OTHER PUBLICATIONS

USPTO; Restriction Requirement dated Jul. 14, 2022 in U.S. Appl. No. 17/376,238.

(Continued)

*Primary Examiner* — Kim S. Horger
(74) *Attorney, Agent, or Firm* — Snell & Wilmer L.L.P.

(57) ABSTRACT

Methods and systems for forming molybdenum layers on a surface of a substrate and structures and devices formed using the methods are disclosed. Exemplary methods include forming an underlayer prior to forming the molybdenum layer. The underlayer can be used to manipulate stress in the molybdenum layer and/or reduce a nucleation temperature and/or deposition temperature of a step of forming the molybdenum layer.

11 Claims, 8 Drawing Sheets

(56) References Cited

U.S. PATENT DOCUMENTS

| | | | |
|---|---|---|---|
| 7,927,700 | B2 | 4/2011 | Denul et al. |
| 8,119,240 | B2 | 2/2012 | Cooper |
| 8,207,062 | B2 | 6/2012 | Gao et al. |
| 9,653,537 | B1 | 5/2017 | Jagannathan et al. |
| 10,510,590 | B2 | 12/2019 | Thombare et al. |
| 2002/0187261 | A1 | 12/2002 | Pyo |
| 2003/0022457 | A1 | 1/2003 | Gutsche et al. |
| 2003/0072884 | A1 | 4/2003 | Zhang et al. |
| 2008/0081922 | A1 | 4/2008 | Meiere et al. |
| 2009/0081866 | A1 | 3/2009 | Lee et al. |
| 2009/0163025 | A1 | 6/2009 | Humayun et al. |
| 2013/0045589 | A1 | 2/2013 | Kim et al. |
| 2013/0109172 | A1 | 5/2013 | Collins et al. |
| 2013/0207101 | A1 | 8/2013 | Yamazaki et al. |
| 2014/0061764 | A1 | 3/2014 | Takashima et al. |
| 2015/0176712 | A1 | 6/2015 | Davis |
| 2015/0184297 | A1 | 7/2015 | Kim et al. |
| 2016/0099355 | A1 | 4/2016 | Walker |
| 2017/0121356 | A1* | 5/2017 | Garratt ............... C23C 16/34 |
| 2018/0053660 | A1 | 2/2018 | Jandl et al. |
| 2018/0068846 | A1* | 3/2018 | Haukka ............ H01L 21/02192 |
| 2018/0247821 | A1 | 8/2018 | Chen et al. |
| 2018/0261503 | A1 | 9/2018 | Meng et al. |
| 2018/0294187 | A1 | 10/2018 | Thombare et al. |
| 2019/0067094 | A1 | 2/2019 | Zope et al. |
| 2019/0096681 | A1 | 3/2019 | Wei et al. |
| 2019/0172839 | A1 | 6/2019 | Tokuda |
| 2019/0372038 | A1 | 12/2019 | Baldo et al. |
| 2020/0199743 | A1 | 6/2020 | Wright et al. |
| 2020/0212046 | A1* | 7/2020 | Ishii ...................... H10B 12/02 |

FOREIGN PATENT DOCUMENTS

| | | |
|---|---|---|
| JP | 2016098406 A | 5/2016 |
| KR | 20080057086 A | 6/2008 |
| KR | 20080097791 A | 11/2008 |

OTHER PUBLICATIONS

USPTO; Non-Final Office Action dated Sep. 30, 2022 in U.S. Appl. No. 17/376,238.

USPTO; Notice of Allowance dated Jan. 30, 2023 in U.S. Appl. No. 17/376,238.

Ng, Vincent Ming Hong, et al., "Recent progress in layered transition metal carbides and/or nitrides (MXenes) and their composites: synthesis and applications". Journal of Materials Chemisty A, 2017, 5, 3039-3068.

Tian, Xinlong, et al., "Transition Metal Nitride Coated with Atomic Layers of Pt as a Low-Cost, Highly Stable Electrocatalyst for the Oxygen Reduction Reaction". J. Am. Chem. Soc. 2016, 138, 5, 1575-1583.

Anasori, Babak, et al., "Two-Dimensional, Ordered, Double Transition Metals Carbides (MXenes)". ACSNano, vol. 9, No. 10, 2015, 9507-9516.

Seh, Zhi Wei, et al., "Two-dimensional layered transition metal disulphides for effective encapsulation of high-capacity lithium sulphide cathodes". Nature Communications, 5:5017, 2014, pp. 1-8.

Jin, Huanyu, et al., "Molten Salt-Directed Catalytic Synthesis of 2D Layered Transition-Metal Nitrides for Efficient Hydrogen Evolution". Chem 6, Sep. 10, 2020, 2382-2394.

Yang, Wenlong, et al., "Transition Metal (Fe, Co and Ni) Carbide and Nitride Nanomaterials: Structure, Chemical Synthesis and Applications". ChemNanoMat 2015, 1, 376. Abstract Only.

Wang, Guilei, et al., "Application of Atomic Layer Deposition Tungsten (ALD W) as Gate Filling Metal for 22 nm and Beyond Nodes CMOS Technology". ECS Transactions, 58 (10) 317-324 (2013).

* cited by examiner

METHOD AND SYSTEM FOR DEPOSITING MOLYBDENUM LAYERS

CROSS-REFERENCE TO RELATED APPLICATIONS

This application is a divisional of, and claims priority to and the benefit of, U.S. patent application Ser. No. 17/376,238, filed Jul. 15, 2021 and entitled "METHOD FOR DEPOSITING MOLYBDENUM LAYERS USING AN UNDERLAYER," which is a nonprovisional of, and claims priority to and the benefit of, U.S. Provisional Patent Application No. 63/054,118, filed Jul. 20, 2020 and entitled "METHOD AND SYSTEM FOR DEPOSITING MOLYBDENUM LAYERS," all of which are hereby incorporated by reference herein.

FIELD OF INVENTION

The present disclosure generally relates to methods and systems suitable for forming layers on a surface of a substrate and to structures including the layers. More particularly, the disclosure relates to methods and systems for forming layers that include molybdenum and to structures formed using the methods and systems.

BACKGROUND OF THE DISCLOSURE

The scaling of electronic devices, such as semiconductor devices, has led to significant improvements in performance and density of integrated circuits. However, conventional device scaling techniques face significant challenges for future technology nodes.

For example, one challenge has been finding suitable conducting materials for use for metal gap fill applications, liner applications, and the like that exhibit desired properties, such as desired effective resistivity, low deposition temperature, and/or property (e.g., film stress) tunability. Accordingly, improved methods and systems for forming a metal layer with one or more such properties are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This section introduces a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming structures including molybdenum layers, to structures formed using such methods, and to systems for performing the methods and/or for forming the structures. The molybdenum layers can be used in a variety of applications, including gap fill (e.g., for complementary metal oxide semiconductor (CMOS)) applications, for use as a liner or barrier layer (e.g., for 3D-NAND or DRAM word-line) applications, for interconnect applications, and the like. Further, as set forth in more detail below, examples of the disclosure can be used to deposit molybdenum layers at relatively low temperatures, compared to traditional techniques to deposit molybdenum layers.

In accordance with exemplary embodiments of the disclosure, a method of forming a structure is disclosed. Exemplary methods of forming the structure include providing a substrate, forming an underlayer comprising one or more of a transition metal sulfide, a transition metal carbide, and a transition metal nitride on a surface of the substrate, and forming a molybdenum layer overlying the underlayer. The transition metal can be a Group 4 to Group 7 transition metal—e.g., selected from the group consisting of titanium, tungsten, molybdenum, vanadium, niobium, tantalum, cobalt, hafnium, and zirconium. In accordance with examples of the disclosure, a thickness of the underlayer is greater than 0 nm and less than 10 nm, about 1-10 nm, about 1-5 nm, or greater than 5 nm and less than 10 nm. In accordance with additional examples, the step of forming the underlayer comprises a cyclic deposition process. The cyclical deposition process can include providing a transition metal precursor to a reaction chamber, providing one or more of a carbon, a sulfur, and a nitrogen reactant to the reaction chamber, and providing a reducing reactant to the reaction chamber. The step of forming the molybdenum layer can include a cyclic deposition process. A temperature during the step of forming the underlayer and/or forming the molybdenum layer can be less than 650° C., less than 600° C., less than 550° C., less than 500° C., between about 300° C. and 600° C., between about 300° C. and 650° C., between about 300° C. and 550° C., between about 300° C. and 500° C., or between about 300° C. and 450° C. In some cases, a temperature of a substrate during the step of forming the underlayer can be less than a temperature during the step of forming the molybdenum layer. A pressure within the reaction chamber during the step of forming the molybdenum layer can be less than 760 Torr, about 0.2 to about 300 Torr, about 0.5 to about 60 Torr, or about 20 to about 80 Torr. A pressure within the reaction chamber during the step of forming the underlayer layer can be about 1 to about 760 Torr, about 0.2 to about 300 Torr, about 0.5 to about 50 Torr, or about 0.5 to about 20 Torr. A pressure within the reaction chamber during the step of forming the underlayer can be less than a pressure during the step of forming the molybdenum layer—e.g., within a range specified above.

In accordance with yet further exemplary embodiments of the disclosure, a structure is formed using a method as described herein. The structure can include a substrate, an underlayer formed overlying the substrate, and a molybdenum layer formed overlying the underlayer. The underlayer can be used to manipulate stress within the subsequently formed molybdenum layer and/or to enhance nucleation of the molybdenum layer and thereby reduce a deposition temperature (e.g., a temperature of the substrate) used during a step of forming the molybdenum layer overlying the underlayer. The molybdenum layer can be used for a variety of applications, including gap fill, as a liner or barrier, as an interconnect, or the like.

In accordance with yet additional examples of the disclosure, a system to perform a method as described herein and/or to form a structure or portion thereof, is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
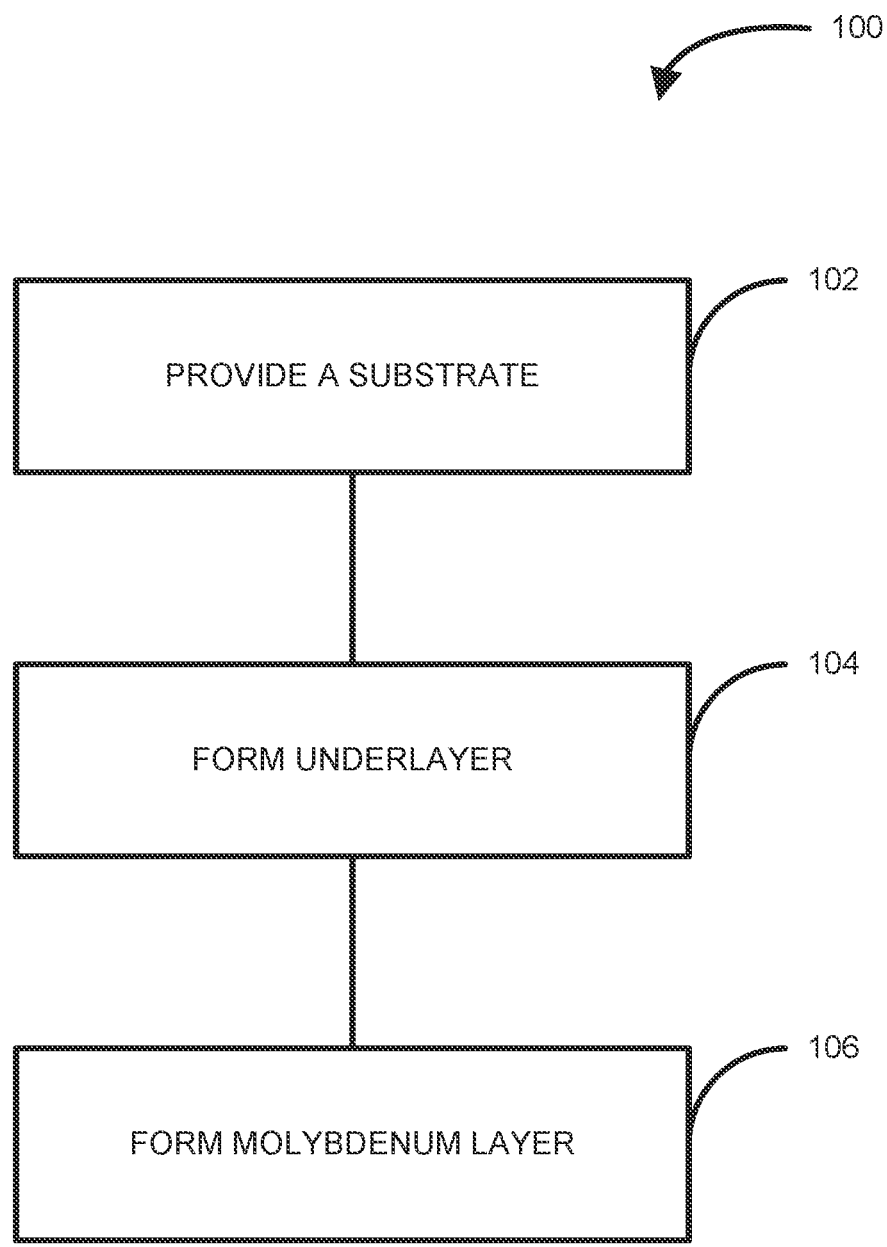
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined in various combinations or may be applied separate from each other.

As set forth in more detail below, various embodiments of the disclosure provide methods for forming structures suitable for a variety of applications. Exemplary methods can be used to, for example, form molybdenum layers, suitable gap fill applications, interconnect applications, barrier or liner applications, or the like. However, unless noted otherwise, the invention is not necessarily limited to such examples.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include helium, argon, and any combination thereof. In some cases, an inert gas can include nitrogen and/or hydrogen.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can be or include a substrate as described herein. Structures can include one or more layers overlying the substrate, such as one or more layers formed according to a method as described herein.

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. The terms method and process can be used interchangeably.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, a "molybdenum layer" can be a material layer that can be represented by a chemical formula that includes molybdenum, such as metallic molybdenum.

As used herein, a "molybdenum precursor" includes a gas or a material that can become gaseous and that can be represented by a chemical formula that includes molybdenum.

As used herein, a "molybdenum halide precursor" includes a gas or a material that can become gaseous and that can be represented by a chemical formula that includes molybdenum and a halogen, such as one or more of fluorine (F), chlorine (Cl), bromine (Br), and iodine (I).

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

The term "sulfur reactant" can refer to a gas or a material that can become gaseous and that can be represented by a chemical formula that includes sulfur. In some cases, the chemical formula includes sulfur and hydrogen. In some cases, the sulfur reactant does not include atomic sulfur.

The term "carbon reactant" can refer to a gas or a material that can become gaseous and that can be represented by a chemical formula that includes carbon. In some cases, the chemical formula includes carbon and hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 of forming a structure in accordance with exemplary embodiments of the disclosure. Method 100 includes the steps of providing a substrate (step 102), forming an underlayer (step 104), and forming a molybdenum layer (step 106).

During step 102, a substrate is provided within a reaction chamber. The reaction chamber used during step 102 can be or include a reaction chamber of a chemical vapor deposition reactor system configured to perform a cyclical deposition process. The reaction chamber can be a standalone reaction chamber or part of a cluster tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 20° C. and approximately 800° C., less than 650° C., less than 600° C., less than 550° C., less than 500° C., between about 300° C. and 600° C., between about 300° C. and 650° C., between about 300° C. and 550° C., between about 300° C. and 500° C., or between about 300° C. and 450° C. In some cases, the temperature of the substrate during step 102 and/or step 104 is less than a temperature of the substrate during step 106.

In addition to controlling the temperature of the substrate, a pressure within the reaction chamber may also be regulated. For example, in some embodiments of the disclosure, the pressure within the reaction chamber during step 102 and/or step 104 may be less than 760 Torr or between about 0.2 to about 300 Torr, about 0.5 to about 50 Torr, or about 0.5 to about 20 Torr. A pressure within the reaction chamber during step 102 and/or step 104 can be less than a pressure during the step of forming the molybdenum layer. The temperatures and pressures of step 102 are suitable temperatures and pressures for step 104.

During step 104, an underlayer comprising one or more of a transition metal sulfide, a transition metal carbide, and a transition metal nitride is formed on a surface of the substrate. The underlayer can be formed using a cyclical deposition process, such as a cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of reactants. Such a process may be referred to as cyclical CVD. In some embodiments, a cyclical CVD process may comprise the introduction of two or more reactants into the reaction chamber, wherein there may be a time period of overlap between the two or more reactants in the reaction chamber, resulting in both an ALD component of the deposition and a CVD component of the deposition. This is referred to as a hybrid process. In accordance with further examples, a cyclical deposition process may comprise the continuous flow of one reactant/precursor and the periodic pulsing of a second reactant into the reaction chamber.

In accordance with some examples of the disclosure, the cyclical deposition process is a thermal deposition process. In these cases, the cyclical deposition process does not include use of a plasma to form activated species for use in the cyclical deposition process. For example, the cyclical deposition process may not comprise formation or use of nitrogen, sulfur, or carbon plasma, may not comprise formation or use of excited nitrogen, sulfur, or carbon species, and/or may not comprise formation or use of nitrogen, sulfur, or carbon radicals.

In other cases, step 104 can include forming excited species from one or more precursors, reactants, and inert gases. The excited species can be formed using a direct and/or remote plasma.

The cyclical deposition process can include (e.g., separately and/or sequentially) providing a transition metal precursor to the reaction chamber and providing a reactant to the reaction chamber.

Figure 2:
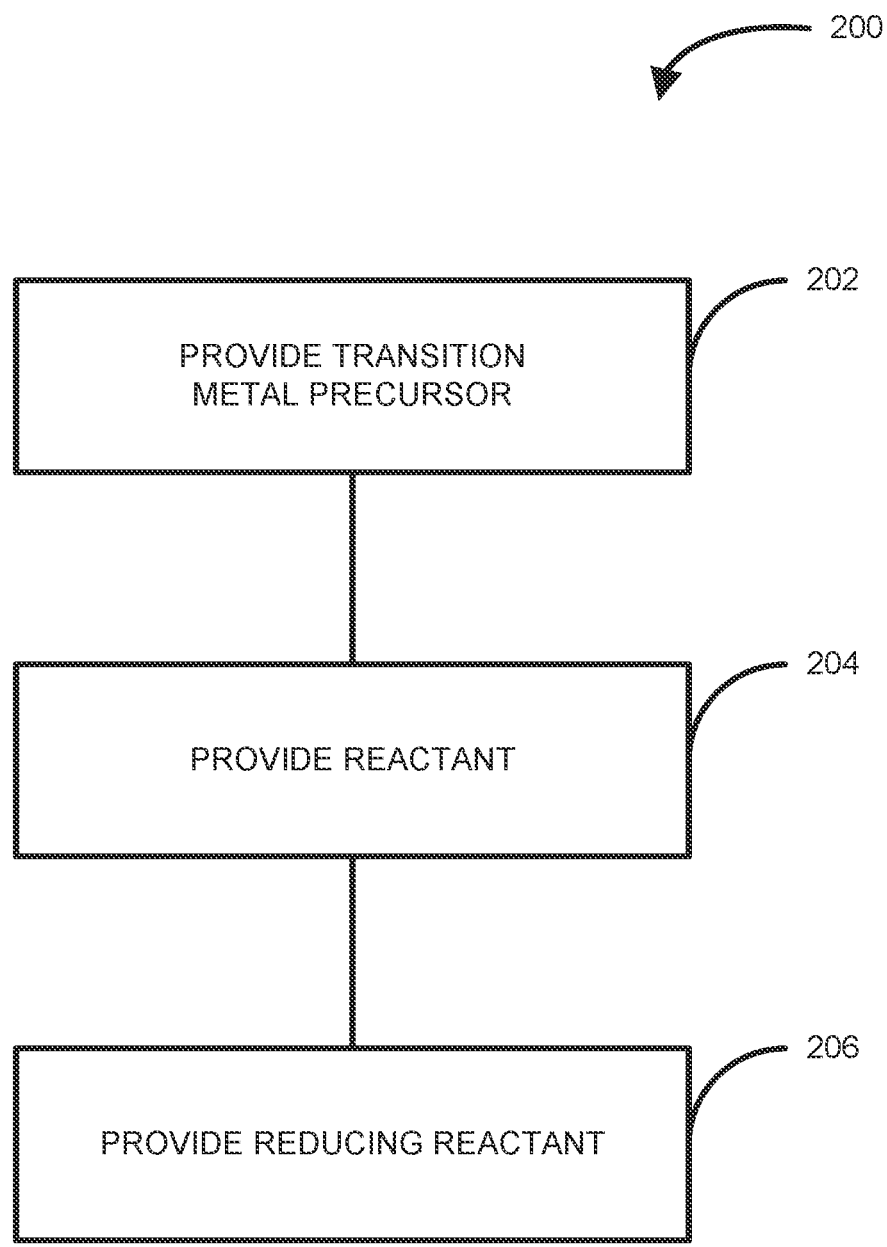
FIG. 2 illustrates a process in accordance with exemplary embodiments of the disclosure.

An exemplary cyclical deposition process 200 suitable for step 104 is illustrated in FIG. 2. Process 200 includes a step of providing a transition metal precursor to a reaction chamber (step 202), providing one or more of a carbon reactant, a sulfur reactant, and a nitrogen reactant to the reaction chamber (step 204), and providing a reducing reactant to the reaction chamber (step 206). Unless otherwise stated, steps 202-206 need not be performed in the order illustrated. For example, process 200 can include step 202 followed by step 206 followed by step 204. Alternatively, process 200 can include only steps 202 and 204 or steps 202 and 206.

The transition metal in the transition metal precursor can include a metal selected from a Group 4 to Group 7 transition metal. By way of examples, the transition metal can be selected from the group consisting of titanium, tungsten, molybdenum, vanadium, niobium, tantalum, cobalt, hafnium, and zirconium.

In accordance with further examples of the disclosure, the transition metal precursor can include one or more of a transition metal halide, a transition metal chalcogenide halide, a transition metal carbonyl, a transition metalorganic precursor, and a transition metal organometallic precursor.

By way of examples, the transition metal can be or include molybdenum. In this case, the transition metal precursor can include one or more of a molybdenum halide a molybdenum oxyhalide, a molybdenum organometallic compound, a molybdenum metal organic compound, or the like.

By way of particular examples, a molybdenum halide can be selected from one or more of a molybdenum fluoride, a molybdenum chloride, a molybdenum bromide, and a molybdenum iodide. The molybdenum halide can include only molybdenum and one or more halogens. Exemplary suitable molybdenum halides include or more of molybdenum trichloride ($MoCl_3$), molybdenum tetrachloride ($MoCl_4$), molybdenum pentachloride ($MoCl_5$), molybdenum hexachloride ($MoCl_6$), and molybdenum hexafluoride ($MoF_6$).

A molybdenum oxyhalide can be selected from one or more of molybdenum oxyhalides, such as one or more of a molybdenum oxyfluoride, a molybdenum oxychloride, a molybdenum oxybromide, and a molybdenum oxyiodide. The molybdenum oxyhalide can include only molybdenum, oxygen, and one or more halogens. By way of examples, the molybdenum oxyhalide can be selected from compounds including one or more of bromine, chlorine and iodine, and include one or more of molybdenum (V) trichloride oxide ($MoOCl_3$), molybdenum (VI) tetrachloride oxide ($MoOCl_4$), and molybdenum (IV) dichloride dioxide ($MoO_2Cl_2$).

Additional exemplary molybdenum precursors include molybdenum hexacarbonyl ($Mo(CO)_6$), tetrachloro(cyclopentadienyl)molybdenum, $Mo(tBuN)_2(NMe_2)_2$, $Mo(NBu)_2(StBu)_2$, $(Me_2N)_4Mo$, $(iPrCp)_2MoH_2$, $Mo(NMe_2)_4$, $Mo(NEt_2)_4$, $Mo_2(NMe_2)_6$, $Mo(tBuN)_2(NMe_2)_2$, $Mo(NtBu)_2(StBu)_2$, $Mo(NtBu)_2(iPr_2AMD)_2$, $Mo(thd)_3$, $MoO_2(acac)_2$, $MoO_2(thd)_2$, $MoO_2(iPr_2AMD)_2$, $Mo(Cp)_2H_2$, $Mo(iPrCp)_2H_2$, $Mo(\eta_6\text{-ethylbenzene})_2$, $MoCp(CO)_2(\eta_3\text{-allyl})$, and $MoCp(CO)_2(NO)$.

Exemplary transition metal (e.g., molybdenum) precursors can include "heteroleptic" or mixed ligand precursors, where any combination of the exemplary ligand types in any attainable number (typically, 3-5 ligands, but there can be exceptions) can be attached to the transition metal/molybdenum atom. In some cases, the transition metal/molybdenum precursor comprises at least one halide ligand.

Use of halide and oxyhalide precursors or a precursor including at least one halide ligand can be advantageous relative to methods that use other precursors, such as metalorganic precursors, because such precursors, and especially halide and oxyhalide precursors, can be relatively inexpensive, can result in molybdenum layers with lower concentrations of impurities, such as carbon, and/or processes that use such precursors can be more controllable—compared to processes that use metalorganic or other molybdenum or other transition metal precursors. Further, such precursors can be used with or without the assistance of a plasma to form excited species. In addition, processes that use transition metal halide precursors may be easier to scale up, compared to methods that use organometallic transition metal precursors.

During step 204, one or more of a carbon reactant, a sulfur reactant, and a nitrogen reactant is provided to the reaction chamber.

Exemplary nitrogen reactants can be selected from one or more of nitrogen ($N_2$), ammonia ($NH_3$), hydrazine ($N_2H_4$) or a hydrazine derivate, a mixture of hydrogen and nitrogen, nitrogen ions, nitrogen radicals, and excited nitrogen species, and other nitrogen and hydrogen-containing gases. The nitrogen reactant can include or consist of nitrogen and hydrogen. In some cases, the nitrogen reactant does not include diatomic nitrogen.

Exemplary sulfur reactants include hydrogen sulfide ($H_2S$), sulfur (e.g., $S_8$), thiols (e.g., alkyl and aryl thiols), compounds including disulfide bonds, compounds including a sulfur-alkyl group bond, and compounds represented by the formula R—S—S—R' or S—R, wherein R and R' are independently selected from aliphatic (e.g., C1-C8) and aromatic groups, sulfur halides (e.g., including one sulfur, such as $SCl_2$ or $SBr_2$, or one halide, such as disulfur dichloride). The alkyl thiols can include C1-C8 alkyl thiols.

Exemplary carbon reactants include acetylene, ethylene, alkyl halide compounds, alkene halide compounds, metal alkyl compounds, and the like. Exemplary alkyl halide compounds include $CX_4$, $CHX_3$, $CH_2X_2$, $CH_3X$, where X=F, Cl, Br, or I. Exemplary alkene halide compounds include $C_2H_3X$, $C_2H_2X_2$, $C_2HX_3$, and $C_2X_4$, where X=F, Cl, Br, or I. Exemplary alkyne halide compounds include $C_2X_2$ and $HC_2X$, where X=F, Cl, Br, or I. Exemplary metal alkyl compounds include $AlMe_3$, $AlEt_3$, $Al(iPr)_3$, $Al(iBu)_3$, $Al(tBu)_3$, $GaMe_3$, $GaEt_3$, $Ga(iPr)_3$, $Ga(iBu)_3$, $Ga(tBu)_3$, $InMe_3$, $InEt_3$, $In(iPr)_3$, $In(iBu)_3$, $In(tBu)_3$, and $ZnMe_2$, $ZnEt_2$.

During step 206, a reducing reactant is provided to the reaction chamber. The reducing reactant can include one or more of hydrogen, hydrogen radicals, hydrogen ions, silane with a formula $Si_nH_{(2n+2)}$, germane with a formula $Ge_nH_{2n+2}$, borane with a formula $B_nH_{n+4}$ or $B_nH_{n+6}$, other boron hydrides, volatile metal hydrides and adducts thereof, such as DIBAL and $R_3N$—$AlH_3$, where R is any alkyl or aryl group inclusive of those that possess a heteroatom capable of forming a chelate with the metal.

In some cases, two or more precursors and/or two or more reactants can be flowed to the reaction chamber, such that the two or more precursors and/or two or more reactants overlap within the reaction chamber. For example, one or more nitrogen reactants and one or more carbon reactants can be coflowed to the reaction chamber.

In the case of thermal cyclical deposition processes, a duration of the step of providing reactant to the reaction chamber can be relatively long to allow the reactant to react with the precursor or a derivative thereof. For example, the duration can be about 0.1 to about 30 seconds, about 1 to 1 about 5 seconds, or about 1.5 to about 10 seconds.

As part of step 104/process 200, the reaction chamber can be purged using a vacuum and/or an inert gas to, for example, mitigate gas phase reactions between precursors/reactants and enable self-saturating surface reactions—e.g., in the case of ALD. Additionally or alternatively, the substrate may be moved to separately contact a first vapor phase reactant and a second vapor phase reactant. The reaction chamber can be purged and/or the substrate moved after the step of providing a precursor to the reaction chamber and/or after the step of providing a reactant to the reaction chamber and/or after the step of providing a reducing reactant to the reaction chamber.

In some embodiments of the disclosure, process 200 includes repeating a unit deposition cycle that includes (1) a transition metal precursor to a reaction chamber, (2) providing a reactant to the reaction chamber, and (3) providing a reducing reactant to the reaction chamber, with optional purge or move steps after step (1) and/or step (2) and/or step (3). The deposition cycle can be repeated one or more times, based on, for example, desired thickness of the underlayer layer—e.g., greater than 0 nm and less than 10 nm, about 1-10 nm, about 1-5 nm, or greater than 5 nm and less than 10 nm.

Figure 3:
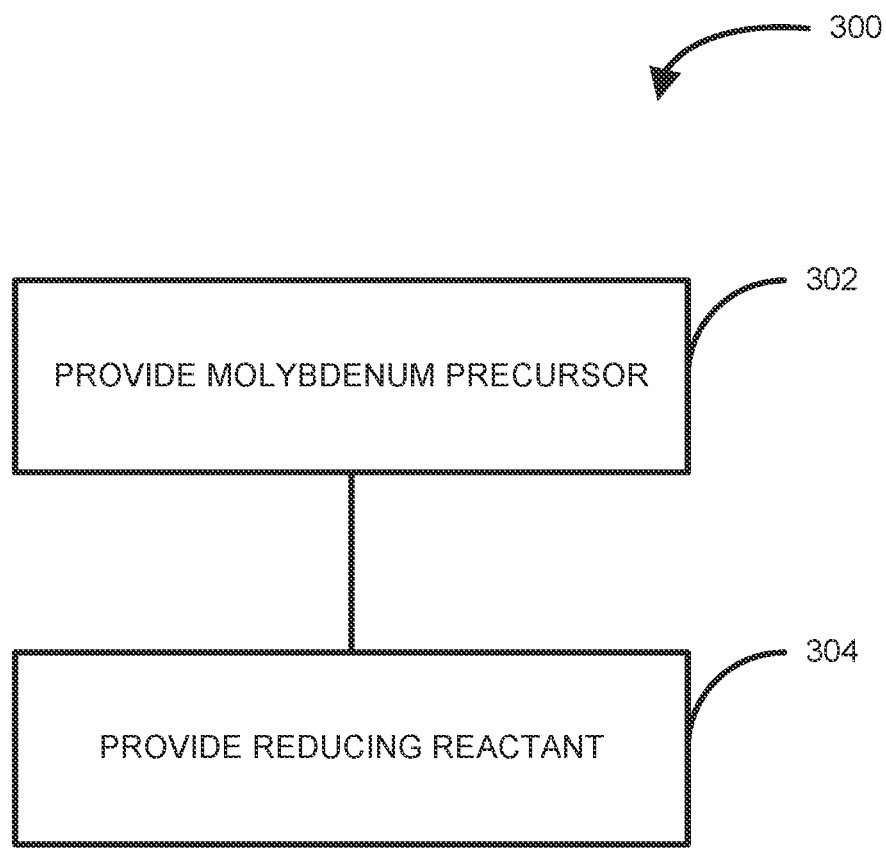
FIG. 3 illustrates a process in accordance with exemplary embodiments of the disclosure.

Once the underlayer has been deposited to a desired thickness, method 100 proceeds to step 106. Similar to step 104, step 106 can include a cyclical process. An exemplary cyclical process suitable for step 106 is illustrated in FIG. 3 as process 300.

Process 300 includes providing a molybdenum precursor to a reaction chamber (step 302) and providing a reducing reactant to the reaction chamber (step 304).

During step 302, a molybdenum precursor is provided to a reaction chamber—e.g., the same reaction chamber used in step 104. The molybdenum precursor can be or include any of the molybdenum precursors noted above.

As noted above, use of an underlayer as formed above can allow for relatively low deposition temperatures during process 300. For example, a deposition temperature during step 106/process 300 can be less than 650° C., less than 600° C., less than 550° C., less than 500° C., between about 300° C. and 600° C., between about 300° C. and 650° C., between about 300° C. and 550° C., between about 300° C. and 500° C., or between about 300° C. and 450° C. A pressure within the reaction chamber during step 106/process 300 can be between about 0.2 to about 300 Torr, about 0.5 to about 60 Torr, or about 20 to about 80 Torr. As noted above, a substrate temperature and/or reaction chamber pressure during step 106 can be higher than the substrate temperature and/or reaction chamber pressure during step 102 and/or step 104.

In accordance with various examples of the disclosure, a process condition, such as temperature, pressure, precursor flowrate, reactant flowrate, and whether or not excited species are formed can be used to manipulate stress in the molybdenum layer by manipulating one or more process conditions during step 104 and/or 106. For example, use of the underlayer allows for deposition of molybdenum layers at lower temperatures. Process conditions during step 104 (formation of the underlayer) can be manipulated to manipulate stress in an overlying molybdenum layer. The molybdenum layers deposited (e.g., over dielectric material, such as aluminum oxide) at the lower temperatures, such as the temperatures noted above, allows for molybdenum layers with relatively more compressive stress compared to molybdenum layers deposited without the underlayer and/or at higher temperatures. Further, by controlling the process conditions during steps 104 and 106, it is possible to have stress modulation on molybdenum layers and achieve compressive stress in the layers of up to about 450 MPa or greater than 200 MPa for, for example, a 20 nm molybdenum layer.

SPECIFIC EXAMPLES

The specific examples provided below are merely exemplary and are presented for illustration purposes. Unless otherwise noted, these examples are not meant to limit the scope of the claims.

Figure 6:
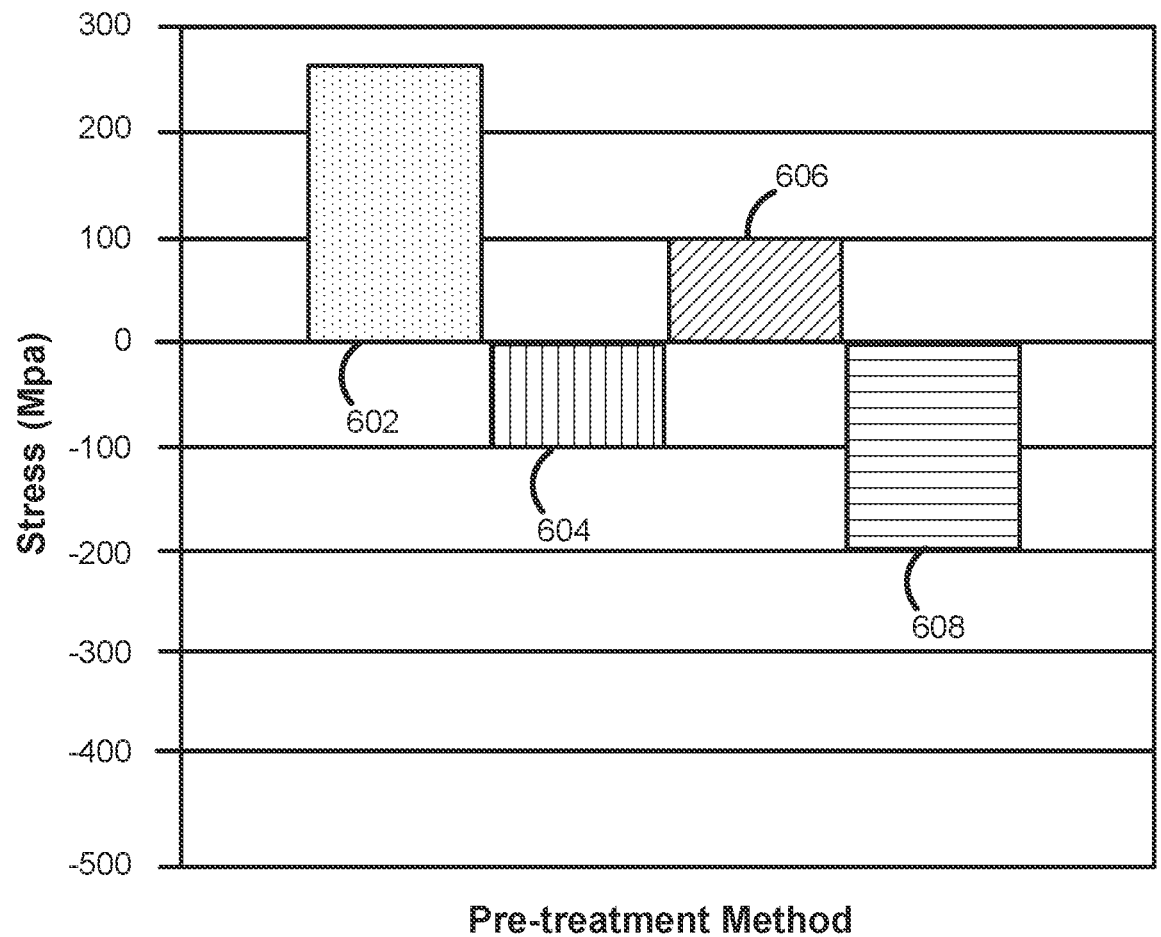
FIGS. 6-8 illustrate molybdenum film stress in films and structures formed in accordance with examples of the disclosure.
Figure 7:
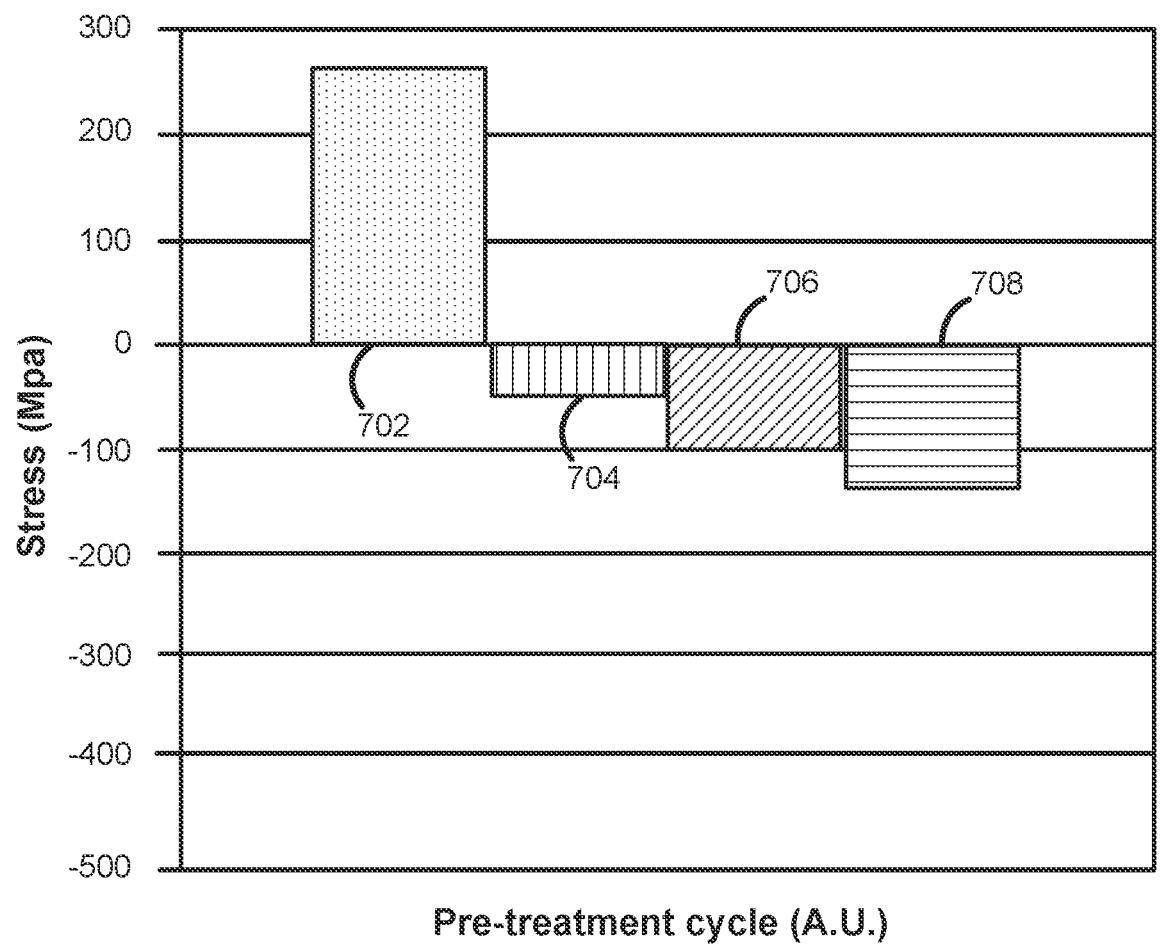
Figure 8:
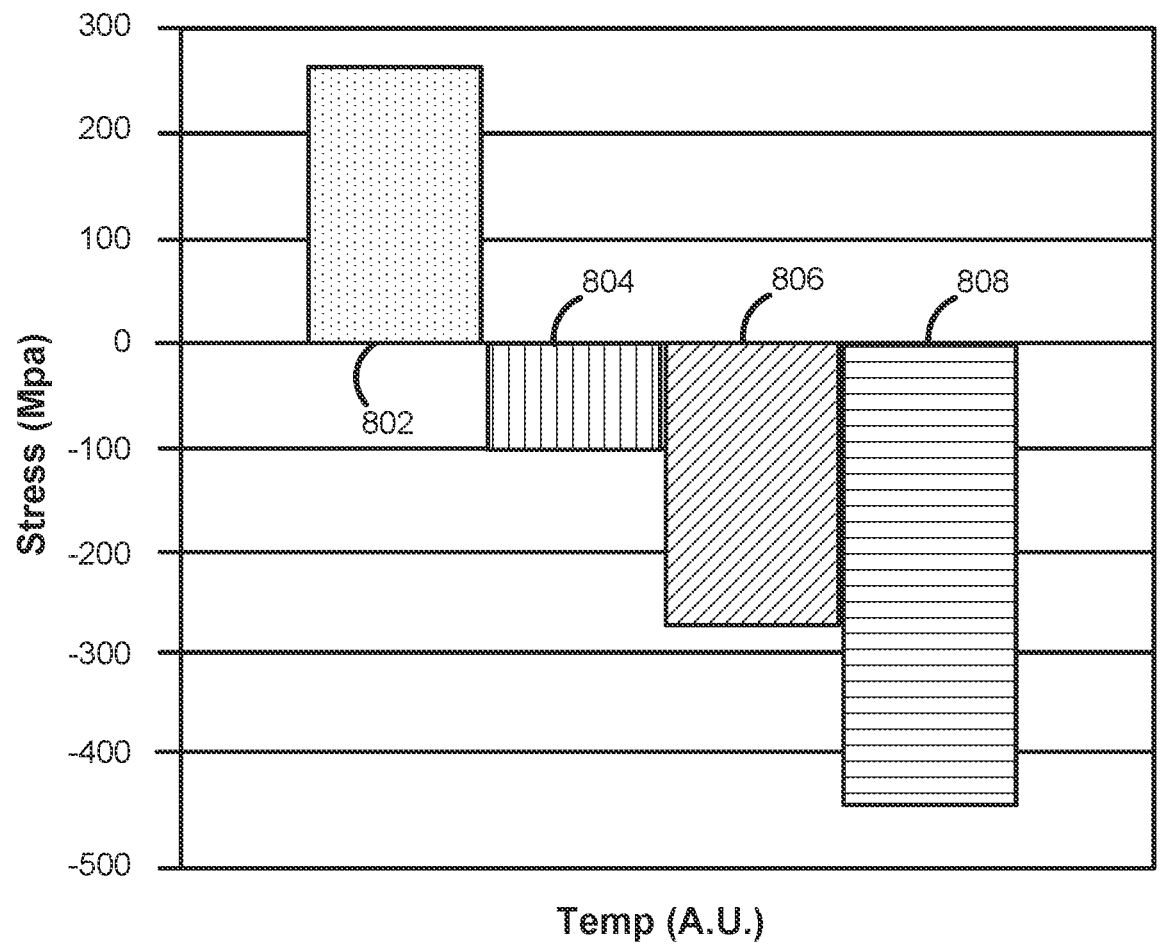

FIGS. 6-8 illustrate film stress of molybdenum layers formed overlying an aluminum oxide layer using varying conditions, illustrating examples of how process conditions and/or properties of an underlayer in accordance with the present disclosure can be used to manipulate stress of an overlying molybdenum layer. FIG. 6 illustrates stress values for molybdenum layers deposited with no underlayer (602); with a molybdenum layer formed using a 0.25 s molybdenum precursor (e.g., $MoO_2Cl_2$) pulse, a 20 s nitrogen pulse (e.g., $NH_3$), a 6 s reducing agent (e.g., $H_2$) pulse, at 2 Torr and 450° C. (604) (Pre-treat1); a molybdenum layer formed using a 0.25 s molybdenum precursor pulse, a 60 s reducing agent pulse, and a 0.1 s nitrogen reactant pulse, at 8 Torr and 500° C. (606) (Pre-treat2); and 1 s molybdenum precursor, 30 s nitrogen reactant, 5 s reducing agent, 2 Torr and 450° C. (608) (Pre-treat3). The underlayer thickness was about 20 Angstroms. The temperature during the molybdenum layer deposition step was about 550° C.

FIG. 7 illustrates stress in molybdenum layers deposited over a substrate with varying underlayer thicknesses. In particular, stress values are illustrated for molybdenum films formed over an aluminum oxide layer with no underlayer (702), with about 10 Angstrom underlayer (704), with about 20 Angstrom underlayer (706), and about 30 Angstrom underlayer (708). The conditions to form the layers in FIG. 7 were similar to those of Pre-treat1, except for the number of cycles, which varied.

FIG. 8 illustrates an effect of temperature during molybdenum layer deposition. In particular, stress values are illustrated for molybdenum films formed over an aluminum oxide layer with no underlayer (802), with a molybdenum formed at about 550° C. (804), with a molybdenum formed at about 525° C. (806), and with a molybdenum formed at about 475° C. (808). The conditions to form the layers with the stress values illustrated in FIG. 8 were similar to those of Pre-treat1.

In some embodiments, a step coverage of molybdenum layer is equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 and about 25.

Figure 4:
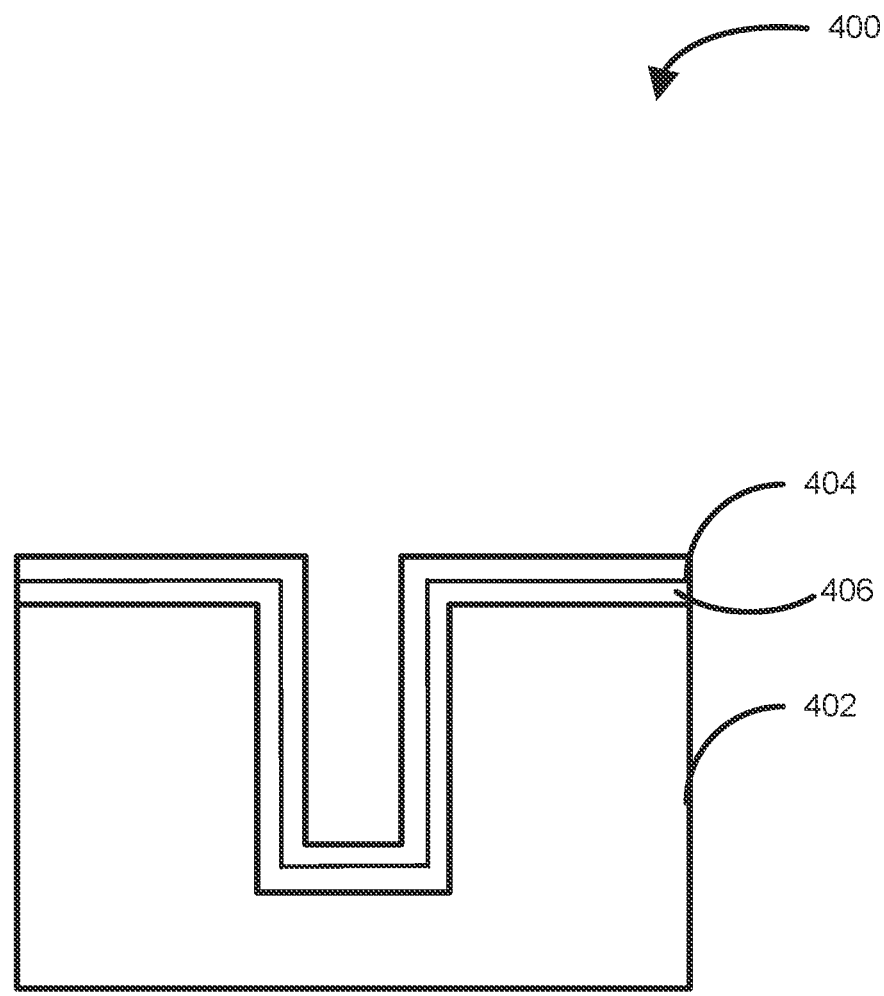
FIG. 4 illustrates a structure in accordance with examples of the disclosure.

FIG. 4 illustrates a structure/a portion of a device 400 in accordance with additional examples of the disclosure. Device portion or structure 400 includes a substrate 402, a molybdenum layer 404, and an underlayer 406 in between (e.g., in contact with one or both) substrate 402 and molybdenum layer 404.

Substrate 402 can be or include any of the substrate material described herein. In accordance with examples of the disclosure, substrate 402 includes a dielectric or insulating layer.

The dielectric or insulating layer can include one or more dielectric or insulating material layers. By way of example, dielectric or insulating layer can be high-k material, such as, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$), lanthanum oxide ($La_2O_3$), titanium nitride, and mixtures/laminates comprising one or more such layers.

Molybdenum layer 404 and underlayer 406 can be formed according to a method described herein. When underlayer 406 is formed using a cyclical deposition process, a concentration of underlayer 406 constituents (e.g., a transition metal, C, S, or N) can vary from a bottom of underlayer 406 to a top of underlayer 406 by, for example, controlling an amount of precursor and/or reactant(s) and/or respective pulse times during one or more deposition cycles. In some cases, molybdenum layer 404 can be molybdenum metal. A stress of molybdenum layer 404 can be altered by altering properties (e.g., thickness and/or composition) and/or process conditions during the formation of underlayer 406.

Molybdenum layer 404 can include impurities, such as halides, hydrogen or the like in an amount of less than one atomic percent, less than 0.2 atomic percent, less than 0.1 atomic percent, or less than 0.05 atomic percent, alone or combined.

Additionally or alternatively, molybdenum layer 404 can form a continuous film—e.g., using method 100—at a thickness of <5 nm, <4 nm, <3 nm, <2 nm, <1.5 nm, <1.2 nm, <1.0 nm, or <0.9 nm.

Figure 5:
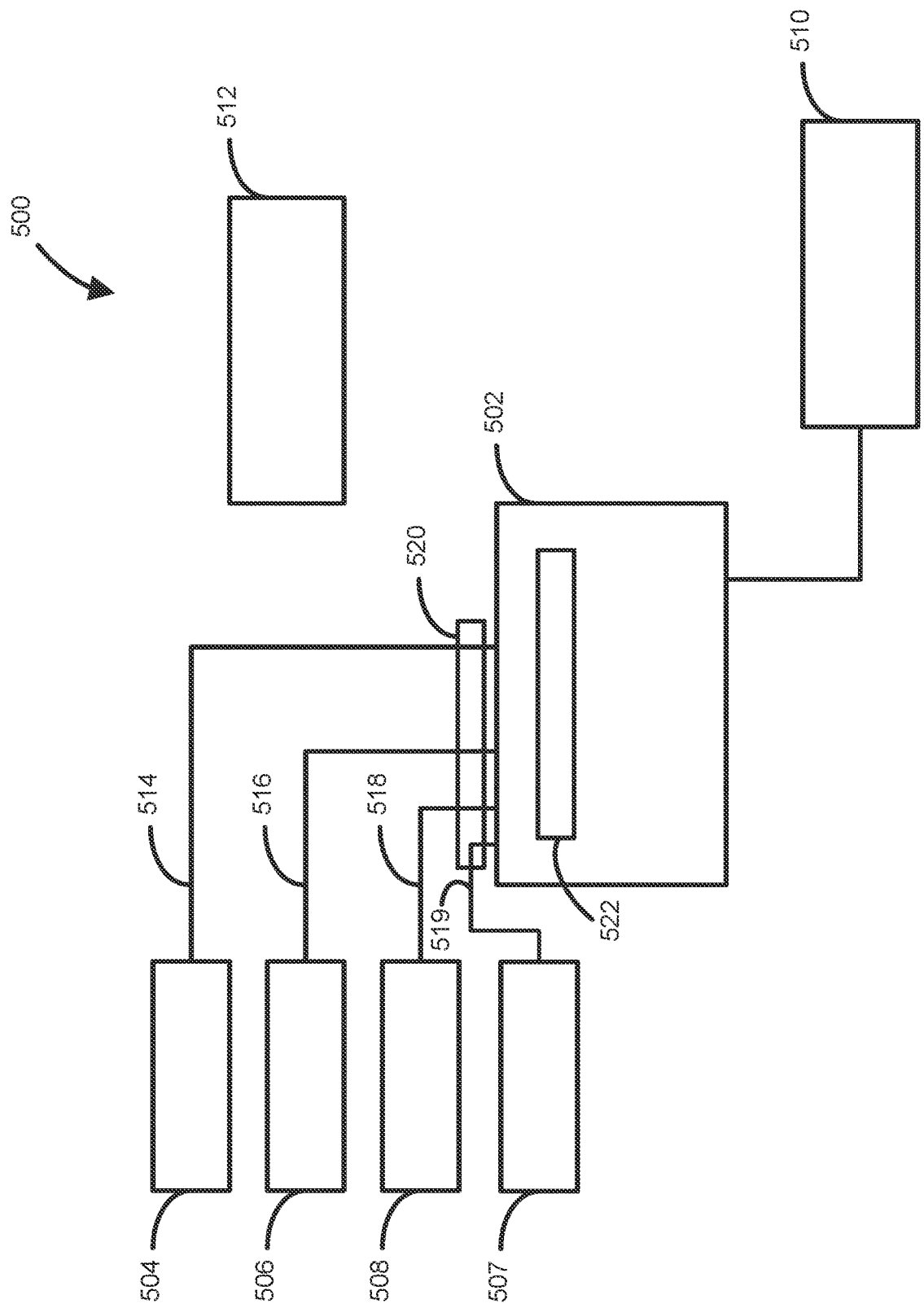
FIG. 5 illustrates a reactor system in accordance with additional exemplary embodiments of the disclosure.

FIG. 5 illustrates a system 500 in accordance with yet additional exemplary embodiments of the disclosure. System 500 can be used to perform a method or process as described herein and/or form a structure or device portion as described herein.

In the illustrated example, system 500 includes one or more reaction chambers 502, a precursor gas source 504, a reactant gas source 506, a reducing reactant source 507, a purge gas source 508, an exhaust source 510, and a controller 512.

Reaction chamber 502 can include any suitable reaction chamber, such as an ALD or CVD reaction chamber.

Precursor gas source 504 can include a vessel and one or more molybdenum precursors as described herein—alone or mixed with one or more carrier (e.g., inert) gases. Reactant gas source 506 can include a vessel and one or more reactants as described herein—alone or mixed with one or more carrier gases. Reducing reactant source 507 can include one or more reducing reactants—alone or mixed with one or more carrier gases. Purge gas source 508 can include one or more inert gases as described herein. Although illustrated with four gas sources 504, 506, 507, and 508, system 500 can include any suitable number of gas sources. For example, system 500 can include another transition metal precursor source. Gas sources 504, 506, 507, and 508 can be coupled to reaction chamber 502 via lines 514, 516, 518, and 519, which can each include flow controllers, valves, heaters, and the like.

Exhaust source 510 can include one or more vacuum pumps.

Controller 512 includes electronic circuitry and software to selectively operate valves, manifolds, heaters, pumps and other components included in system 500. Such circuitry and components operate to introduce precursors, reactants, and purge gases from the respective sources 504, 506, 507, and 508. Controller 512 can control timing of gas pulse sequences, temperature of the substrate and/or reaction chamber, pressure within the reaction chamber, and various other operations to provide proper operation of system 500. Controller 512 can include control software to electrically or pneumatically control valves to control flow of precursors, reactants and purge gases into and out of reaction chamber 502. Controller 512 can include modules such as a software or hardware component, e.g., a FPGA or ASIC, which performs certain tasks. A module can advantageously be configured to reside on the addressable storage medium of the control system and be configured to execute one or more processes.

System 500 can include one or more remote excitation sources 520 and/or direct excitation sources 522, such as remote and/or direct plasma generation apparatus.

Other configurations of system 500 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 502. Further, as a schematic representation of a system, many components have been omitted for simplicity of illustration, and such components may include, for example, various valves, manifolds, purifiers, heaters, containers, vents, and/or bypasses.

During operation of reactor system 500, substrates, such as semiconductor wafers (not illustrated), are transferred from, e.g., a substrate handling system to reaction chamber 502. Once substrate(s) are transferred to reaction chamber 502, one or more gases from gas sources 504, 506, 507, and 508, such as precursors, reactants, carrier gases, and/or purge gases, are introduced into reaction chamber 502.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A structure comprising a substrate formed by a plurality of steps comprising:
forming an underlayer comprising one or more of a transition metal sulfide, a transition metal carbide, and a transition metal nitride on a surface of the substrate; and
forming a molybdenum layer overlying the underlayer, wherein the step of forming the underlayer comprises a deposition process, and
wherein the deposition process comprises:
providing a transition metal precursor to a reaction chamber; and
providing one or more of a carbon reactant, a sulfur reactant, and a nitrogen reactant to the reaction chamber, wherein the carbon reactant comprises one or more of acetylene, ethylene, alkyl halide compounds, alkene halide compounds, and metal alkyl compounds.

2. The structure of claim 1, wherein the underlayer comprises the transition metal nitride.

3. The structure of claim 1, wherein the underlayer comprises a transition metal selected from a Group 4 to Group 7 transition metal.

4. The structure of claim 1, wherein a thickness of the underlayer is greater than 0 nm and less than 10 nm.

5. The structure of claim 1, wherein the transition metal precursor comprises one or more of a transition metal halide, a transition metal chalcogenide halide, a transition metal carbonyl, a transition metalorganic precursor, and a transition metal organometallic precursor.

6. The structure of claim 1, wherein the nitrogen reactant comprises one or more of nitrogen ($N_2$), ammonia ($NH_3$), hydrazine (N$_2$H$_4$) or a hydrazine derivate, a mixture of hydrogen and nitrogen, nitrogen ions, nitrogen radicals, and excited nitrogen species.

7. The structure of claim 1, wherein the sulfur reactant comprises one or more of hydrogen sulfide (H$_2$S), sulfur, thiols, compounds comprising disulfide bonds, compounds comprising a sulfur-alkyl group bond, and compounds represented by the formula R—S—S—R' or S—R, wherein R and R' are independently selected from aliphatic and aromatic groups, and sulfur halides.

8. The structure of claim 1, wherein the step of forming the molybdenum layer comprises:
   providing a molybdenum precursor to a reaction chamber; and
   providing a reducing reactant to the reaction chamber.

9. The structure of claim 8, wherein the molybdenum precursor comprises one or more of a molybdenum halide, a molybdenum chalcogenide halide, a molybdenum carbonyl, a molybdenum metalorganic precursor, and a molybdenum organometallic precursor.

10. The structure of claim 8, wherein the molybdenum precursor comprises at least one halide ligand.

11. The structure of claim 8, wherein the molybdenum precursor comprises at least one of molybdenum tetrachloride (MoCl$_4$), molybdenum pentachloride (MoCl$_5$), molybdenum hexachloride (MoCl$_6$), molybdenum hexafluoride (MoF$_6$), molybdenum hexacarbonyl (Mo(CO)$_6$), tetrachloro (cyclopentadienyl) molybdenum, molybdenum (V) trichloride oxide (MoOCl$_3$), molybdenum (VI) tetrachloride oxide (MoOCl$_4$), and molybdenum (IV) dichloride dioxide (MoO$_2$Cl$_2$), Mo(tBuN)$_2$(NMe$_2$)$_2$, Mo(NBu)$_2$(StBu)$_2$, (Me$_2$N)$_4$Mo, (iPrCp)$_2$MoH$_2$, Mo(NMe$_2$)$_4$, Mo(NEt$_2$)$_4$, Mo$_2$(NMe$_2$)$_6$, Mo(tBuN)$_2$(NMe$_2$)$_2$, Mo(NtBu)$_2$(StBu)$_2$, Mo(NtBu)$_2$(iPr$_2$AMD)$_2$, Mo(thd)$_3$, MoO$_2$(acac)$_2$, MoO$_2$(thd)$_2$, MoO$_2$(iPr$_2$AMD)$_2$, Mo(Cp)$_2$H$_2$, Mo(iPrCp)$_2$H$_2$, Mo($\eta_6$-ethylbenzene)$_2$, MoCp(CO)$_2$($\eta$3-allyl), and MoCp(CO)$_2$(NO).

\* \* \* \* \*